United States Patent [19]
Taniguchi

[11] Patent Number: 5,384,479
[45] Date of Patent: Jan. 24, 1995

[54] FIELD EFFECT TRANSISTOR WITH T-SHAPED GATE ELECTRODE

[75] Inventor: Akihisa Taniguchi, Itami, Japan

[73] Assignee: Mitsubishi Denki Kabushiki Kaisha, Tokyo, Japan

[21] Appl. No.: 958,788

[22] Filed: Oct. 9, 1992

[30] Foreign Application Priority Data

Oct. 14, 1991 [JP] Japan ................................. 3-296354

[51] Int. Cl.$^6$ ..................... H01L 29/76; H01L 29/94; H01L 23/48; H01L 23/52
[52] U.S. Cl. ................................. 257/412; 257/408; 257/383; 257/764; 257/768
[58] Field of Search ............... 257/284, 289, 408, 412, 257/413, 768, 769, 382, 383, 764; 437/189, 192

[56] References Cited

U.S. PATENT DOCUMENTS 5,115,290  5/1992  Murakami et al. ................... 257/412

FOREIGN PATENT DOCUMENTS

| 0417646 | 3/1991 | European Pat. Off. | ............. 257/412 |
| 57-149777 | 9/1982 | Japan | ..................... 257/769 |
| 57-152168 | 9/1982 | Japan | ..................... 257/280 |
| 61-194781 | 8/1986 | Japan | ..................... 257/280 |
| 63-44771 | 2/1988 | Japan | ..................... 257/368 |

OTHER PUBLICATIONS

Smith et al, "A 0.25-$\mu$m Gate-Length Pseudomorphic HFET With 32-mW Output Power At 94 GHz", IEEE Electron Device Letters, vol. 10, No. 10, Oct. 1989, pp. 437–439.
"Process For Making Very Small, Asymmetricm Field–Effect Transistors", IBM Technical Disclosure Bulletin, vol. 30, No. 3, Aug. 1987, pp. 1136–1137.
Ohta et al, Quadruply Self-Aligned MOS (QSA MOS)— A New Short-Channel High-Speed High––Density MOSFET for VLSI, IEEE Journal of Solid-State Circuits, vol. SC-15, No. 4, Aug. 1980, pp. 417–423.
Ueda et al, A New Vertical Double Diffused MOSFET—The Self—Aligned Terraced—Gate MOSFET, IEEE Transactions on Electron Devices, vol. ED-31, No. 4, Apr. 1984, pp. 416–420.
Suzuki et al, A New Self-Aligned GaAs FET With A Mo/WSi$_x$ T-Gate, IEEE Electron Device Letters, vol. EDL-6, No. 10, Oct. 1985, pp. 542–544.
Rodder et al, "Raised Source/Drain MOSFET With Dual Sidewall Spacers", IEEE Electron Device Letters, vol. 12, No. 3, Mar. 1991, pp. 89–91.

*Primary Examiner*—Steven Ho Yin Loke
*Attorney, Agent, or Firm*—Leydig, Voit & Mayer

[57] ABSTRACT

A semiconductor device with a small gate-source capacitance is fabricated by growing a semiconductor epitaxial layer of a first conductivity type on a substrate. Two metal layers that are etched at different rates are successively deposited on the epitaxial layer. The metal layers are dry-etched to form a gate electrode including a wider (larger gate length) upper gate electrode section and a narrower (smaller gate length) lower gate electrode section. The upper gate electrode section is used as a mask for implanting a dopant impurity into the semiconductor epitaxial layer to form a source region having an edge close to but not extending beneath the lower gate electrode section.

22 Claims, 3 Drawing Sheets

FIELD EFFECT TRANSISTOR WITH T-SHAPED GATE ELECTRODE

The present invention relates generally to a semiconductor device and, more particularly, to a field effect transistor with improved high frequency characteristics and a method of fabricating such a field effect transistor.

BACKGROUND OF THE INVENTION

Insulated gate field effect transistors and, more particularly, metal-oxide-semiconductor (MOS) field effect transistors are voltage-controlled devices and have high input impedance. Because of their features, including the above-stated ones, which are advantageous over bipolar transistors, they are widely used as discrete devices or IC constituent devices which are operated in low frequency regions or in high frequency regions.

FIG. 1 shows a cross-section of a major portion of a conventional insulated gate field effect transistor (IGFET) having the most conventional structure. The IGFET 20 includes a substrate, for example, a P+-type silicon (Si) substrate 10, a P-type silicon epitaxial layer 11 deposited on one surface of the substrate 10, and an insulating layer 12 of, for example, silicon oxide, overlying the surface of the epitaxial layer 11. The epitaxial layer 11 includes therein a source-side N-type lightly-doped-drain (hereinafter referred to as LDD) region or source region 16, and a N-type drain-side LDD region or drain region 17 spaced from the source-side LDD region 16 by a small distance l. On that portion of the insulating layer 12 which is above the portion of the layer 11 between the regions 16 and 17 having a length l, a gate electrode 13 is disposed. A passivation coating 18 is disposed on the insulating layer 12 and the gate electrode 13. For reasons attributable to a manufacturing process, which will be described later, the edges of the two LDD regions 16 and 17 facing each other extend beyond the edges of the gate electrode 13 into portions of the epitaxial layer 11 beneath the gate electrode 13. Thus, the regions 16 and 17 overlap the gate electrode 13 by lengths $l_1$ and $l_2$, respectively.

A manufacturing process for the IGFET with the above-described structure is now described with reference to FIG. 2.

First, the p+-type Si substrate (not shown) is prepared. On a surface of the substrate, the P-type Si epitaxial layer 11 is deposited by, for example, CVD (chemical vapor deposition). On the surface of the Si epitaxial layer 11, the insulating layer 12 is formed by, for example, thermal oxidation. A metal film 13a for the gate electrode is deposited on the layer 12 by sputtering or vapor deposition. Next, a resist is applied over the metal film 13a, and, then, any known patterning technique is used to define a resist layer 14 at a location where the gate electrode is to be formed. Thus, a structure shown in FIG. 2(a) results.

Next, the resist layer 14 is used as a mask to etch the metal film 13a, which results in the gate electrode 13 having a desired length L (see FIG. 2(b)). Thereafter, the resist layer 14 on top of the gate electrode 13 is removed. Then, another resist layer 15 is deposited covering the exposed top surface of the gate electrode 13 and the exposed surface of the insulating layer 12. The resist layer 15 is patterned to remove that portion on the left hand side of the center of the gate electrode 13. Next, using the remaining right hand side portion of the resist layer 15 and the exposed portion of the gate electrode 13 as a mask, a conductivity determining impurity producing a conductivity type, N-type in this case, opposite to that of the epitaxial layer 11, is implanted to form the source-side LDD region 16, as shown in FIG. 2(c). Then, the resist layer 15 is completely removed, and an impurity producing the same conductivity type (N-type) as that used for the source-side LDD region 16 is implanted to a much lower amount (i.e. to a low concentration) to form the drain-side LDD 17.

Thereafter, annealing is carried out to stabilize the structure. The dopant impurity injected in the first implantation is diffused in the epitaxial layer 11 not only in the depth direction but also in the lateral direction into a portion beneath the gate electrode 13 during the implantation steps and in the succeeding annealing step, and the impurity injected in the second implantation step is diffused in the epitaxial layer 11 not only in the depth direction but also in the lateral direction into a portion of the layer 11 beneath the gate electrode 13, during the second implantation step and the annealing step. Thus, the overlapping portions having lengths $l_1$ and $l_2$ are formed (FIG. 2(d)).

Thereafter, a passivation coating 18 is deposited over the gate electrode 13 and the insulating layer 12, which results in the device shown in FIG. 1. In both of FIGS. 1 and 2, illustration and explanation of components, such as a source electrode, a drain electrode and electrode leads, which are not directly pertinent to the invention are omitted.

A high frequency cutoff frequency $f_T$, which is one of indices indicative of high frequency characteristics of the IGFET of the above-described structure, is expressed as follows.

$$f_T = g_m / 2\pi C_{gs}$$

where $g_m$ is a transconductance of the IGFET and $C_{gs}$ is the gate-source capacitance of the IGFET.

As is well known, the higher the high frequency cutoff frequency $f_T$, the better the IGFET characteristics in high frequency regions. In the conventional structure of an IGFET shown in FIGS. 1 and 2, because the edge of the source-side LDD region 16 extends into the portion of the layer 11 beneath the gate electrode 13, the gate-source capacitance $C_{gs}$ is large. As a result, the cutoff frequency $f_T$ is lowered, and the high frequency characteristics of the IGFET are degraded.

In order to improve the high frequency characteristics of the IGFET of the above-described structure, the dimensions of the gate electrode 13 should be reduced as much as possible. In order to minimize the dimensions of the gate electrode 13, a highly precise masking technique must be employed in manufacturing the gate electrode 13. In addition, after the formation of the gate electrode 13 of such small dimensions, in order to form the source-side and drain-side LDD regions 16 and 17 by diffusing different amounts of impurities for the respective regions, a highly precise patterning and masking technique has to be employed to define the edge of the resist layer 15 on the gate electrode 13 (FIG. 2c). For higher operating frequencies, the dimensions of the gate electrode 13 become smaller so that higher precision is required for the two masking steps, which makes the manufacturing process complicated and requires a high degree of skill and much care. Accordingly, the manufacturing yield is significantly reduced.

Therefore an object of the present invention is to provide a semiconductor device with improved high frequency characteristics.

Another object of the present invention is to provide an insulated gate field effect transistor which has a small gate-source capacitance and, hence, good high frequency characteristics.

Still another object of the present invention is to provide an insulated gate field effect transistor having a significantly small gate length and having no overlap between a gate electrode and a source-side LDD region so that the gate-source capacitance is very small, which significantly improves high frequency characteristics.

A further object of the present invention is to provide a novel method of fabricating a semiconductor device having improved high frequency characteristics.

A still further object of the present invention is to provide an improve method of fabricating an insulated gate field effect transistor having a small gate-source capacitance and, hence, improved high frequency characteristics.

SUMMARY OF THE INVENTION

A semiconductor device of the present invention includes a semiconductor epitaxial layer having a first conductivity type, source and drain regions formed by implanting into the semiconductor epitaxial layer an impurity producing a conductivity type opposite to the first conductivity type, and a gate electrode disposed on the semiconductor epitaxial layer with an insulating layer interposed therebetween. The gate electrode comprises a stack of a lower gate electrode section having a smaller gate length and an upper gate electrode section having a larger gate length. The source region is formed by implanting an impurity into the semiconductor epitaxial layer with the upper gate electrode section being used as a mask. It is so arranged that the drain-region-side edge of the source region does not overlap the lower gate electrode section, while it can overlap the upper gate electrode section.

A method of manufacturing a semiconductor device according to the present invention includes a step of depositing an insulating layer on a surface of a semiconductor epitaxial layer which is disposed on a substrate, a step of depositing, in the named order on the insulating layer, a first metallic layer which is etched at a relatively high rate by a selected etchant and a second metallic layer which is etched at a relatively low rate by the selected etchant, a step of applying a layer of first resist over said second metallic layer and patterning the first resist layer to leave a portion of said first resist layer which corresponds in shape and dimension to an upper gate electrode section to be formed, while entirely removing the remainder of said first resist layer, a step of subjecting the stacked metallic layers and the insulating layer to dry etching, using the remaining portion of the first resist layer as a mask, whereby the difference in etching rate between said metallic layers produces a stack of an upper gate section having a longer gate length, a lower gate section having a shorter gate length, and the insulating layer, a step of removing the remaining portion of the first resist layer, applying, thereafter, a layer of a second resist over the thus formed stack and the exposed surface portion of the semiconductor epitaxial layer, and then removing that portion of the second resist layer which is located to one side of the center of the upper gate electrode section (where a source region is to be formed), using the remaining portion of the second resist layer and the upper gate electrode section as a mask to implant, into the semiconductor epitaxial layer, an impurity producing conductivity type opposite to that of the semiconductor epitaxial layer to thereby form a source region in the epitaxial layer, and a step of removing the remaining portion of the second resist layer and implanting, into the semiconductor epitaxial layer, an impurity producing conductivity type opposite to that of the epitaxial layer to thereby form a drain region in the semiconductor epitaxial layer.

BRIEF DESCRIPTION OF THE DRAWINGS

Now, the present invention is described in detail by means of an embodiment with reference to the accompanying drawings. It should be noted that throughout the drawings the same reference numerals denote the same or similar components or functions. In the drawings.

DETAILED DESCRIPTION OF THE EMBODIMENTS

Figure 1:
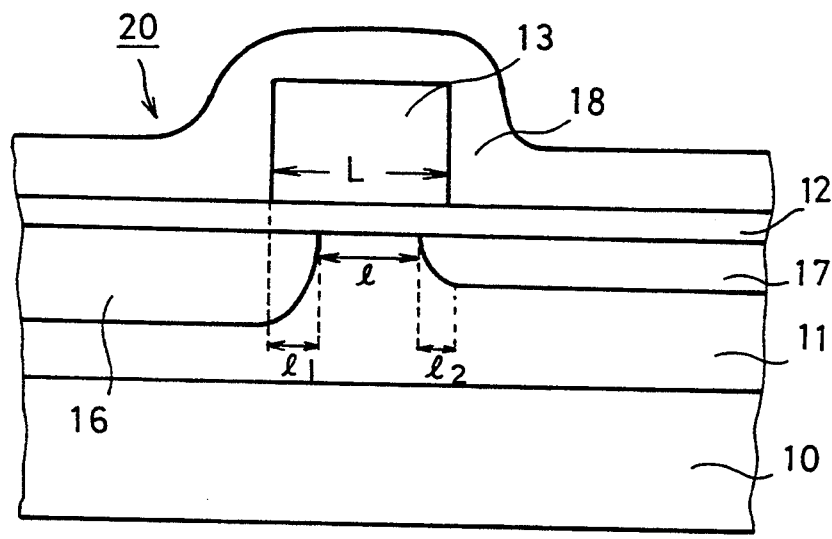
FIG. 1 is a cross-sectional view of a major portion of one of the most conventional insulated gate field effect transistors.
Figure 3:
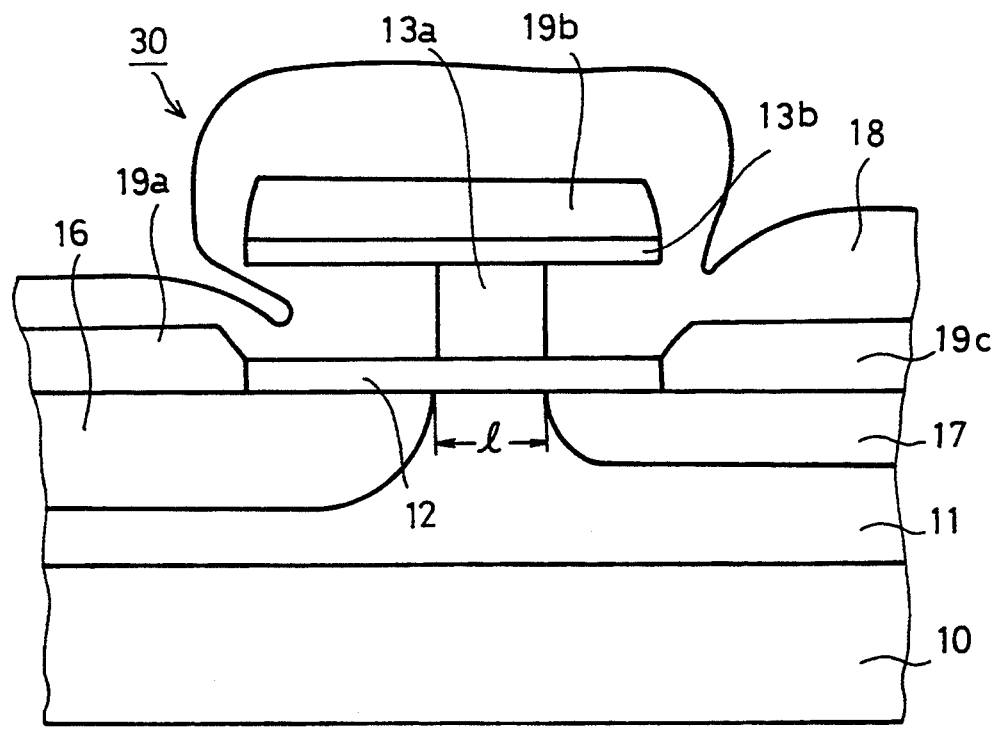
FIG. 3 is a cross-sectional view of a major portion of an insulated gate field effect transistor which is an example of semiconductor devices in which the present invention can be embodied.
Figure 2A:
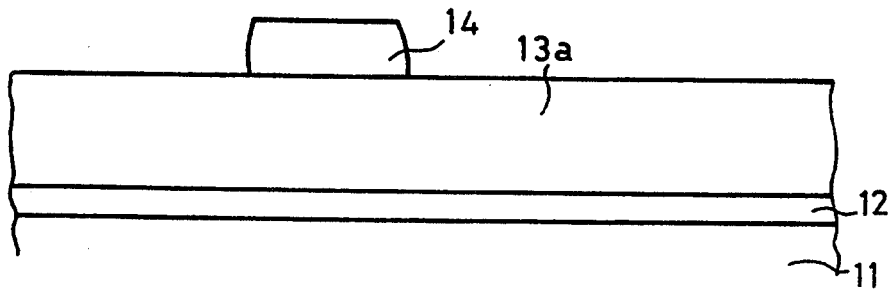
FIGS. 2(a) through 2(d) are cross-sectional views for use in explaining a conventional method of manufacturing the insulated gate field effect transistor shown in FIG. 1.
Figure 2B:
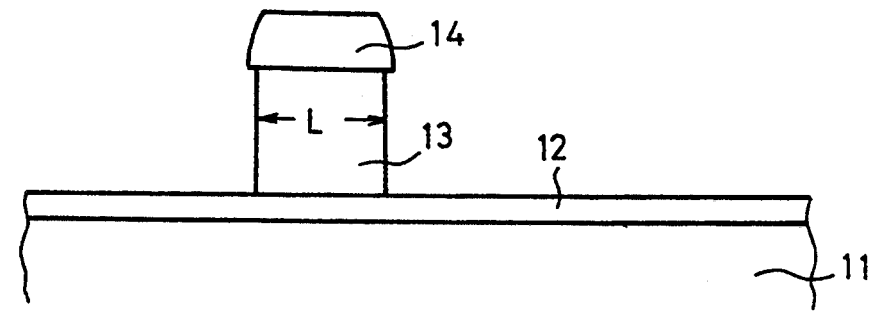
Figure 2C:
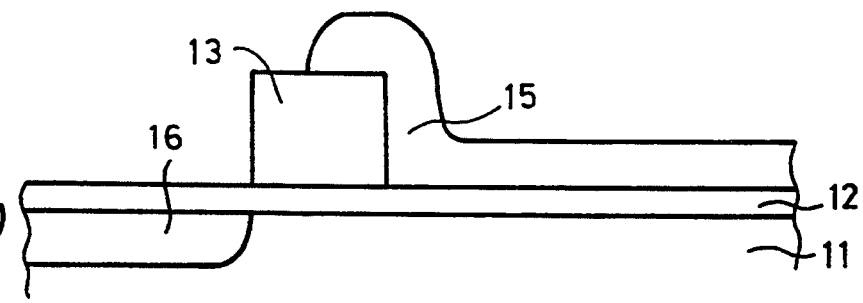
Figure 2D:
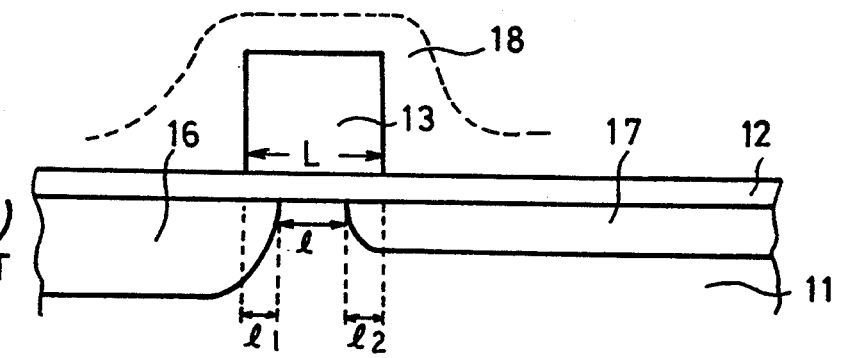

FIG. 3 is a cross-sectional view of a major portion of an insulated gate field effect transistor (IGFET) 30 having improved high frequency characteristics, fabricated in accordance with the present invention. An IGFET is an example of semiconductor devices in which the present invention can be embodied.

As shown, the IGFET 30 includes a suitable substrate, such as a P+-type silicon substrate 10. On one surface of the substrate 10, a P-type silicon epitaxial layer 11 is disposed. An N+-type source-side LDD (Lightly Doped Drain) region or source region 16 is formed in the epitaxial layer 11 adjacent the major surface thereof, and an N-type drain-side LDD region or drain region 17 is formed also in the epitaxial layer 11 adjacent to the major surface thereof. The source region 16 and the drain region 17 face to each other and are mutually spaced by a small distance 1. On the surfaces of the LDD regions 16 and 17; a source electrode 19a and a drain electrode 19c are disposed, respectively. On the surface of the portion of the epitaxial layer 11 between the electrodes 19a and 19c (or, in other words, the surface portion of the epitaxial layer 11 between the LDD regions 16 and 17 plus some surface portions of the LDD regions 16 and 17), a gate insulating layer (such as a silicon oxide layer) 12 is disposed. A lower gate electrode section 13a consisting of a gate electrode metal, such as molybdenum, is disposed on the insulating layer 12 just above the portion of the epitaxial layer 11 between the two LDD regions 16 and 17. On top of the lower gate electrode section 13a, and upper gate electrode section 13b is disposed. As will be described later, the upper gate electrode section 13b is a metallic material which is etched at a slower rate than the metallic material of the lower gate electrode section 13a by a selected etchant used in the manufacturing process. By purposefully utilizing the difference in etching rates the upper gate electrode section 13b is formed to extend laterally longer than the lower gate electrode section 13a. A gate electrode 19b is disposed on the upper gate electrode section 13b, and a passivation film 18 overlies the entire surface of the structure. In FIG. 3, electrode leads and other components which are not important to the subject of the invention are not shown for simplicity.

Next, a method of manufacturing the IGFET 30 shown in FIG. 3, according to one embodiment, is described with reference to FIGS. 4(a) through 4(e).

First, a substrate 10 (not shown) is prepared. A P-type silicon epitaxial layer 11 is grown on one surface of the substrate 10. As the substrate 10, a semiconductor substrate, an insulating substrate, a semiconductor layer disposed on an insulating member, or any other suitable substrate well known in the semiconductor technical field may be used. In the illustrated embodiment, a P+-type silicon substrate is used. On the surface of the epitaxial layer 11 on the P+-type silicon substrate 10, silicon oxide film 12 is disposed, from which a gate insulating layer 12 is made. The silicon oxide film 12 may be formed by, for example, thermally oxidizing the surface portion of the silicon epitaxial layer 11. Next, molybdenum and titanium-tungsten are deposited in the named order on the silicon oxide film 12 by sputtering or vapor deposition, which results in a stack of a molybdenum film 13a' and a titanium-tungsten film 13b' on the silicon oxide film 12. A first resist is applied over the titanium-tungsten film 13b', and, by means of a photolithographic process, a first resist layer 14 is formed at a location where a gate electrode 13b is to be formed. This provides a structure shown in FIG. 4(a).

Figure 4A:
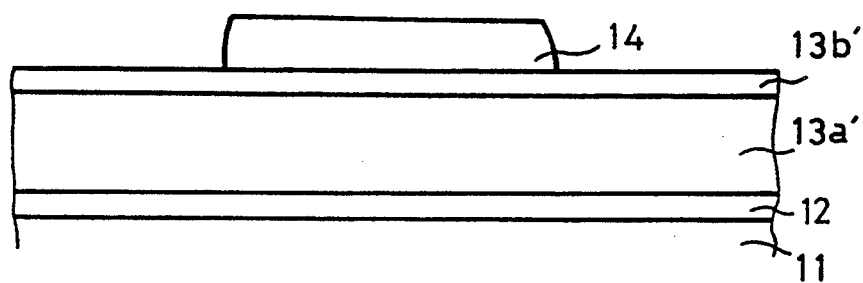
FIGS. 4(a) through 4(e) are cross-sectional views in some of successive steps of a method, according to an embodiment of the present invention, of manufacturing the insulated gate field effect transistor shown in FIG. 3.
Figure 4B:
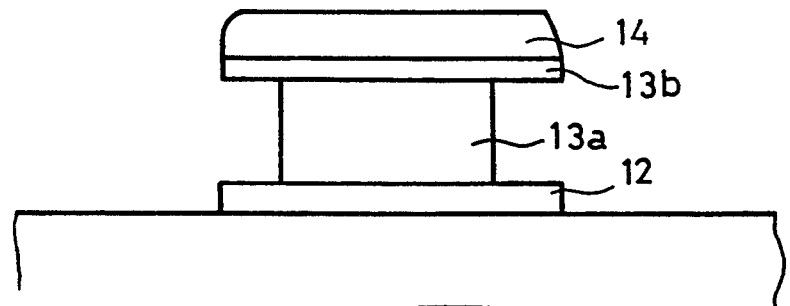

Next, using the first resist layer 14 as a mask, the titanium-tungsten film 13b', the molybdenum film 13a', and the silicon oxide film 12 are subjected to dry etching. A halogen gas to which oxygen ($O_2$) or hydrogen ($H_2$) is added, such as $Cl_2F_2+O_2$, may be used. The metal etching rate of such an etchant gas is relatively slow for titanium-tungsten, relatively fast for molybdenum, and relatively slow for silicon oxide. Accordingly, a relatively long silicon oxide film 12, a relatively short molybdenum film 13a, and a relatively long titanium-tungsten film 13b are left, as shown in FIG. 4(b). The molybdenum film 13a and the titanium-tungsten film 13b are lower and upper gate electrode sections, respectively.

Figure 4C:
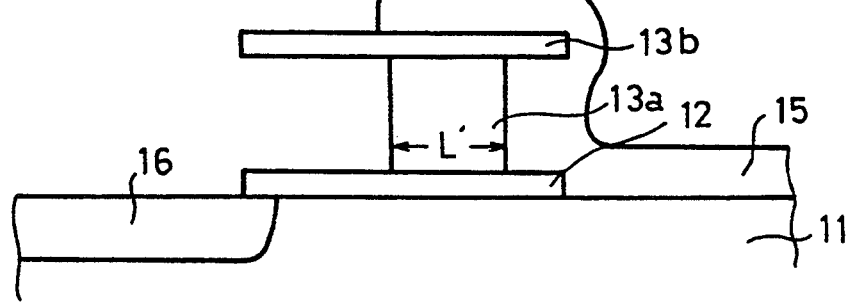

Next, the first resist layer 14 shown in FIG. 4(b) is removed. A resist is again applied over this structure and, by photolithography, a second resist layer 15 is formed, which covers the portion substantially right of the center line of the surface of the upper gate electrode section 13b and extends over the right-hand side portion of the epitaxial layer 11. Another etching process is carried out, using the second photoresist layer 15 as a mask, with the same etching gas as used in the first etching step, namely, $Cl_2F_2+O_2$, or any other etching gas exhibiting a similar etching characteristic. As a result of this etching, the lower gate electrode section 13a of molybdenum is side-etched from the source side (i.e. left-hand side of the drawing) so that the electrode-length measured in the lateral direction, i.e. the gate length $L_i$ is further reduced, as shown in FIG. 4(c). Thus, the lower gate electrode section 13a becomes laterally shorter than the upper gate electrode section 13b and, at the same time, displaced toward the drain-side LDD region (i.e. rightward) relative to the upper gate electrode section 13b.

Using the upper gate electrode section 13b and the second resist layer 15 as a mask, a dopant impurity producing a conductivity type (in this case, N-type) opposite to the P-type epitaxial layer 11 is injected into the epitaxial layer 11. This results in a source-side LDD region or source region 16 (FIG. 4(c)).

Figure 4D:
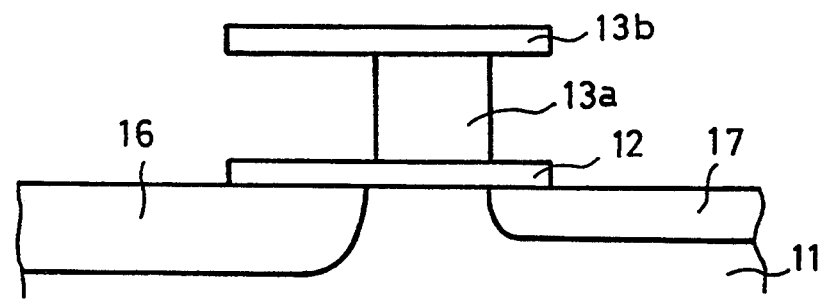
Figure 4E:
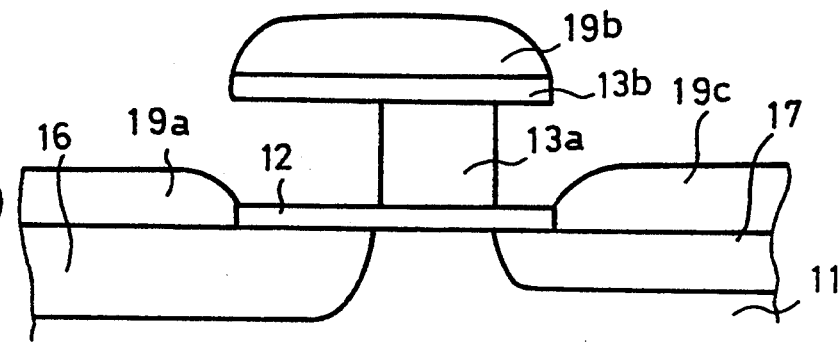

Thereafter, as shown in FIG. 4(d), the second resist layer 15 is removed, and a dopant impurity producing the same conductivity type as the last-mentioned impurity (i.e. N-type) is injected into the epitaxial layer in a much lower concentration than the last-mentioned impurity (low concentration implantation). This results in a drain-side LDD region or drain region 17. After that, the structure is annealed for stabilization. In this particular embodiment, the amount of dopant impurity injected into the epitaxial layer 11 to form the source-side LDD region 16 is larger than the amount of dopant impurity injected to form the drain-side LDD region 17 by about two orders of magnitude.

Next, a stack of metal layers is deposited by a sequential vapor deposition of platinum and, then, gold from the above onto the structure. Since the lower gate electrode section 13a is thinner, like a mushroom stem, than the upper gate electrode section 13b, a source contact 19a, a gate contact 19b, and a drain contact 19c are deposited separately on the source-side LDD region 16, the upper gate electrode section 13b, and the drain-side LDD region 17, respectively, in a self-aligning manner, without resort to the use of any mask. (See FIG. 4(e).) Thereafter, a passivation film 18 is deposited over the entire top surface of the structure. Thus, the IGFET with the structure shown in FIG. 3 has been completed. After that, the device is mounted on a board, leads are connected to the device, and the device is packaged, which results in a final product.

As is understood from the description of the manufacturing method given above, the gate electrode of the semiconductor device of the present invention is formed by dry-etching the molybdenum film 13a' and the titanium-tungsten film 13b' which are etched at different rates by a selected etching agent, and, therefore, the gate electrode has a two-layered structure comprising the lower gate electrode section 13a of molybdenum having a shorter gate length and the upper gate electrode section 13b of titanium-tungsten having a longer gate length. Furthermore, since this longer gate length upper gate electrode section 13b is used as a mask (which defines a window) for forming the source-side LDD region (i.e. source region) 16, the source region can be formed desirably to have an edge, facing the drain electrode, which does not extend into a portion beneath the gate electrode (more specifically, the shorter gate length lower gate electrode section 13a).

Accordingly, the thus completed semiconductor device has a gate electrode with a short effective gate length and with no overlapping of the gate with the source region, so that the gate-source capacitance Cgs is greatly decreased, which results in improved high frequency characteristics of the device with a higher cut-off frequency $f_T$.

According to the present invention, in order to provide a short gate length, neither a mask of smaller dimensions for forming a gate electrode, nor high precision mask registration to precisely dispose a mask on a small gate electrode for forming a source region is required. Accordingly, a high manufacturing yield can be realized.

In the manufacturing process according to the present invention, before forming the source-side LDD region, the lower gate electrode section 13a is side-etched to make it thinner. Accordingly, better high frequency characteristics can be realized than conventional methods in which the gate length is determined only by mask dimensions.

According to another feature of the present invention, since the lower gate electrode section 13a is disposed between the silicon oxide film 12, which is a gate insulating layer, and the upper gate electrode section 13b, and is located significantly inward of the outer periphery of the upper gate electrode section 13b, the use of any masks, which would otherwise be required for providing the source, gate and drain contacts 19a, 19b and 19c comprising low resistance metal (platinum and gold) layers, can be eliminated by sequentially evaporating platinum and gold after the and LDD regions 16, 17 are formed. This reduces the gate series resistance to further improve the high frequency characteristics of the device.

It should be noted that the semiconductor device and the method of making it shown in FIG. 3 and FIGS. 4(a)-4(e) are only exemplary, and the present invention is not limited to them. Various modifications can be made to them.

For example, the conductivity types of the epitaxial layer 11, the LDD region 16, and the LDD region 17 may be reversed from those of the illustrated embodiments to the N-type, the P-type, and the P-type, respectively.

Further, the materials of the lower and upper gate electrode sections 13a and 13b are not limited to molybdenum and titanium-tungsten, respectively, but any combinations of conductive materials may be used, if they can be etched at different rates when simultaneously subjected to dry-etching, to thereby provide the upper gate electrode section 13b with the overhang as shown in FIG. 4(b).

As the materials for the source contact 19a, the gate contact 19b, and the drain contact 19c, aluminum and other metals may be used, other than platinum and gold.

In the described manufacturing method, after the vapor deposition of the source, gate, and drain contacts 19a, 19b and 19c, the passivation coating 18 is deposited, but the passivation coating 18 may be deposited prior to the formation of respective contacts, which may be formed by an ordinary plating technique, using electrode contact openings formed in the coating 18 by photolithography.

In the above-described embodiment, the semiconductor body is an silicon epitaxial layer, but an epitaxial layer of a semiconductor material other than silicon, such as an epitaxial layer of compound semiconductor, such as gallium arsenide (GaAs), may be used. An example of devices using such materials is a GaAs MISFET. Improved high frequency characteristics as stated above can be obtained by applying the present invention to the gate electrode structure of MISFET's.

Further, although a high frequency transistor and a method of making it have been described above, the present invention is also applicable to other types of semiconductor devices such as memories, to provide them with improved high frequency characteristics.

Other various modifications may be possible within the scope of the invention as defined by the claims.

What is claimed is:

1. A semiconductor device comprising:
   a substrate;
   a semiconductor epitaxial layer of a first conductivity type disposed on said substrate;
   source and drain regions having a conductivity type opposite the conductivity type of said semiconductor epitaxial layer disposed in said semiconductor epitaxial layer and spaced from each other;
   an insulating layer overlying at least a portion of said semiconductor epitaxial layer; and
   a gate electrode disposed on said insulating layer and comprising lower and upper gate electrode sections having respective central axes perpendicular to said semiconductor epitaxial layer, said upper gate electrode section having a longer gate length than said lower gate electrode section, said lower gate electrode section being disposed on said insulating layer between said source and drain regions with the central axis of said lower gate electrode section displaced closer to said drain region than the central axis of said upper gate electrode section, said source region not extending beneath said lower gate electrode section in said semiconductor epitaxial layer.

2. A semiconductor device according to claim 1 wherein said upper and lower gate electrode sections have respective opposed first and second edges and the first edge of said upper gate electrode section is farther from the first edge of said lower gate electrode section than the second edge of said upper gate electrode section is from the second edge of said lower gate electrode section.

3. A semiconductor device according to claim 1 including a low resistance metal contact layer disposed on said upper gate electrode section.

4. A semiconductor device according to claim 1 including a low resistance metal contact layer disposed respectively on said upper gate electrode section, said source region, and said drain region.

5. A semiconductor device according to claim 1 wherein said lower gate electrode section is a first metallic material and said upper gate electrode section is a second metallic material different from the first metallic material and said first metallic material has a higher etching rate in an etching process than said second metallic material.

6. A semiconductor device comprising:
   a substrate;
   a semiconductor epitaxial layer of a first conductivity type disposed on said substrate;
   source and drain regions formed by implanting a dopant impurity into said semiconductor epitaxial layer and producing a conductivity type opposite to the first conductivity type, said source and drain regions being spaced from each other;
   an insulating layer overlying at least a portion of said semiconductor epitaxial layer between said source and drain regions; and
   a gate electrode disposed on said insulating layer and comprising lower and upper gate electrode sections having respective central axes perpendicular to said semiconductor epitaxial layer, said upper gate electrode section having a longer gate length than said lower gate electrode section, said lower gate electrode section being disposed on said insulating layer between said source and drain regions with the central axis of said lower gate electrode section displaced closer to said drain region than the central axis of said upper gate electrode section, and said source region being formed by implanting a dopant impurity in said semiconductor epitaxial layer with said upper gate electrode section used as a mask so that said source region is located close to but does not extend beneath said lower gate electrode section in said semiconductor epitaxial layer.

7. A semiconductor device according to claim 6 wherein said upper and lower gate electrode sections have respective opposed first and second edges and the first edge of said upper gate electrode section is farther from the first edge of said lower gate electrode section than the second edge of said upper gate electrode section is from the second edge of said lower gate electrode section.

8. A semiconductor device according to claim 6 wherein said drain region is formed by implanting a dopant impurity in said semiconductor epitaxial layer with said upper gate electrode section used as a mask so that said drain region is located close to but does not extend beneath said lower gate electrode section in said semiconductor epitaxial layer.

9. A semiconductor device according to claim 6 including a low resistance metal contact layer disposed on said upper gate electrode section.

10. A semiconductor device according to claim 6 including a low resistance metal contact layer disposed respectively on said upper gate electrode section, said source region, and said drain region.

11. A semiconductor device according to claim 6 wherein said lower gate electrode section is a first metallic material and said upper gate electrode section is a second metallic material different from the first metallic material and said first metallic material has a higher etching rate in an etching process than said second metallic material.

12. A semiconductor device comprising:
a substrate;
a semiconductor epitaxial layer of a first conductivity type disposed on said substrate;
source and drain regions having a conductivity type opposite the conductivity type of said semiconductor epitaxial layer disposed in said semiconductor epitaxial layer and spaced from each other;
an insulating layer overlying at least a portion of said semiconductor epitaxial layer; and
a gate electrode disposed on said insulating layer and comprising lower and upper gate electrode sections, said upper gate electrode section having a longer gate length than said lower gate electrode section, said lower gate electrode section being disposed on said insulating layer between said source and drain regions, said upper and lower gate electrode sections having respective opposed first and second edges generally transverse to said semiconductor epitaxial layer, the first edge of said upper gate electrode section being farther from the first edge of said lower gate electrode section than the second edge of said upper gate electrode section is from the second edge of said lower gate electrode section, said source region not extending beneath said lower gate electrode section in said semiconductor epitaxial layer.

13. A semiconductor device according to claim 12 wherein said lower and upper gate electrode sections have respective central axes perpendicular to said semiconductor epitaxial layer and the central axis of said lower gate electrode section is displaced closer to said drain region than the central axis of said upper gate electrode section.

14. A semiconductor device according to claim 12 including a low resistance metal contact layer disposed on said upper gate electrode section.

15. A semiconductor device according to claim 12 including a low resistance metal contact layer disposed respectively on said upper gate electrode section, said source region, and said drain region.

16. A semiconductor device according to claim 12 wherein said lower gate electrode section is a first metallic material and said upper gate electrode section is a second metallic material different from the first metallic material and said first metallic material has a higher etching rate in an etching process than said second metallic material.

17. A semiconductor device comprising:
a substrate;
a semiconductor epitaxial layer of a first conductivity type disposed on said substrate;
source and drain regions formed by implanting a dopant impurity into said semiconductor epitaxial layer and producing a conductivity type opposite to the first conductivity type, said source and drain regions being spaced from each other;
an insulating layer overlying at least a portion of said semiconductor epitaxial layer between said source and drain regions; and
a gate electrode disposed on said insulating layer and comprising lower and upper gate electrode sections, said upper gate electrode section having a longer gate length than said lower gate electrode section, said lower gate electrode section being disposed on said insulating layer between said source and drain regions, said upper and lower gate electrode sections having respective opposed first and second edges generally transverse to said semiconductor epitaxial layer, the first edge of said upper gate electrode section being farther from the first edge of said lower gate electrode section than the second edge of said upper gate electrode section is from the second edge of said lower gate electrode section, said source region being formed by implanting a dopant impurity in said semiconductor epitaxial layer with said upper gate electrode section used as a mask so that said source region is located close to but does not extend beneath said lower gate electrode section in said semiconductor epitaxial layer.

18. A semiconductor device according to claim 17 wherein said lower and upper gate electrode sections have respective central axes perpendicular to said semiconductor epitaxial layer and the central axis of said lower gate electrode section is displaced closer to said drain region than the central axis of said upper gate electrode section.

19. A semiconductor device according to claim 17 wherein said drain region is formed by implanting a dopant impurity in said semiconductor epitaxial layer with said upper gate electrode section used as a mask so that said drain region is located close to but does not extend beneath said lower gate electrode section in said semiconductor epitaxial layer.

20. A semiconductor device according to claim 17 including a low resistance metal contact layer disposed on said upper gate electrode section.

21. A semiconductor device according to claim 17 including a low resistance metal contact layer disposed respectively on said upper gate electrode section, said source region, and said drain region.

22. A semiconductor device according to claim 17 wherein said lower gate electrode section is a first metallic material and said upper gate electrode section is a second metallic material different from the first metallic material and said first metallic material has a higher etching rate in an etching process than said second metallic material.

* * * * *